United States Patent
Naundorf et al.

(10) Patent No.: US 7,060,421 B2
(45) Date of Patent: Jun. 13, 2006

(54) CONDUCTOR TRACK STRUCTURES AND METHOD FOR PRODUCTION THEREOF

(75) Inventors: Gerhard Naundorf, Lemgo (DE); Horst Wissbrock, Detmold (DE)

(73) Assignee: LPKF Laser & Electronics AG, Garbsen (DE)

(*) Notice: Subject to any disclaimer, the term of this patent is extended or adjusted under 35 U.S.C. 154(b) by 78 days.

(21) Appl. No.: 10/751,111

(22) Filed: Jan. 5, 2004

(65) Prior Publication Data

US 2004/0241422 A1    Dec. 2, 2004

Related U.S. Application Data

(63) Continuation-in-part of application No. PCT/DE02/02219, filed on Jun. 19, 2002.

(30) Foreign Application Priority Data

Jul. 5, 2001    (DE) ................. 101 32 092

(51) Int. Cl.
   *G03F 7/00*    (2006.01)
(52) U.S. Cl. .................... 430/324; 430/322
(58) Field of Classification Search ........... 430/322, 430/324
   See application file for complete search history.

(56) References Cited

U.S. PATENT DOCUMENTS

| | | | |
|---|---|---|---|
| 4,159,414 A | 6/1979 | Suh et al. ............. | 219/121 |
| 4,416,932 A * | 11/1983 | Nair ..................... | 428/209 |
| 4,604,303 A | 8/1986 | Takakura et al. ....... | 427/229 |
| 5,082,739 A * | 1/1992 | Roy et al. .............. | 501/120 |
| 6,319,564 B1 | 11/2001 | Naundorf et al. ....... | 427/531 |
| 6,696,173 B1 * | 2/2004 | Naundorf et al. ....... | 428/621 |

FOREIGN PATENT DOCUMENTS

| | | |
|---|---|---|
| DE | 197 23 734 A1 | 12/1998 |
| DE | 197 31 346 A1 | 3/1999 |
| EP | 0 180 101 B1 | 12/1991 |
| EP | 0 340 997 B1 | 6/1994 |
| WO | 00/35259 | 6/2000 |

OTHER PUBLICATIONS

International Search Report.

* cited by examiner

*Primary Examiner*—Nicole Barreca
(74) *Attorney, Agent, or Firm*—Crowell & Moring LLP

(57) ABSTRACT

Conductive tracks disposed on an electrically non-conductive support material by depositing a metallized layer on metal nuclei produced by using electromagnetic radiation to break up electrically non-conductive metal compounds dispersed in the support material, and a method for producing them. The electrically non-conductive metal compounds are insoluble spinel-based inorganic oxides which are thermally stable and are stable in acidic or alkaline metallization baths, and which are higher oxides with a spinel structure, and which remain unchanged in non-irradiated areas. The spinel-based inorganic oxides used are heat resistant and remain stable after being subjected to soldering temperatures. The conductor tracks are reliably and easily produced and adhere strongly to the support.

16 Claims, No Drawings

CONDUCTOR TRACK STRUCTURES AND METHOD FOR PRODUCTION THEREOF

CROSS REFERENCE TO RELATED APPLICATIONS

This application is a continuation-in-part of international patent application no. PCT/DE02/02219, filed Jun. 19, 2002, designating the United States of America, and published in German as WO 03/005784 A2, the entire disclosure of which is incorporated herein by reference. Priority is claimed based on Federal Republic of Germany patent application no. DE 101 32 092.2, filed Jul. 5, 2001 and European patent application no. EP 01130189.2, filed Dec. 19, 2001.

BACKGROUND OF THE INVENTION

The invention relates to conductor track structures on an electrically non-conductive supporting material and to a method for the production thereof.

Methods for producing fine, adherent conductor track structures have been disclosed in German Patent Applications DE 197 23 734.7-34 and DE 197 31 346.9 and the special issue entitled "Feinstrukturierte Metallisierung von Polymeren" [Finely Structured Metallization of Polymers], of the technical journal "metalloberfläche," No. 11, Vol. 54 (2000), according to which non-conductive metal chelate complexes are introduced into a non-conductive supporting material. Structured metallization nuclei are then split from these metal chelate complexes using laser radiation and subsequently initiate metallization by chemical reduction in the irradiated partial areas.

Such methods can be used, for example, for producing circuit substrates made of thermoplastic materials using an injection molding process. Compared to alterative methods for producing three-dimensional injection-molded circuit substrates—so-called molded interconnect devices—these methods have the advantage that the tooling costs can be kept relatively low. Furthermore, the number of the required process steps can be reduced because the undecomposed metal chelate complex can remain in non-irradiated areas on the surface of the circuit substrate. As a result, even medium scale production becomes very economical, while a particularly fine resolution of the structure can be achieved.

These advantages are offset by the marginal thermal stability of the described metal chelate complexes with respect to the processing temperatures of modern high-temperature plastics, such as LCP. As a result, this method has limited applicability for this group of materials, which in view of the new lead-free soldering technologies is becoming ever more important. On the other hand, the metal chelate complexes have to be added in relatively large amounts to obtain sufficiently dense nucleation for rapid metallization when activated by laser irradiation. However, the high proportion of these complexes frequently affects important properties of the supporting material, e.g., its elongation at break and its impact strength.

The 1999 Activity Report of the Chair of Production Technology (LFT) of the University of Erlangen-Nürnberg describes an analogous approach in which laser radiation is used to release metallization nuclei that are not chemically integrated as described above but are physically passivated by encapsulation of metal particles. Since the encapsulated particles are significantly larger than the molecules of a typical metal chelate complex, the conflict of goals, i.e., "small admixture to the plastic— high density of nuclei after laser irradiation" leads to substantially greater problems than nucleation using metal chelate complexes that can be split by a laser.

WO 00 35 259 A2 describes a method for producing fine metallic conductor structures on an electrically non-conductive substrate. According to this method an electrically non-conductive metal complex structured with organic complexing agents is applied to, or introduced into, the substrate. The substrate is selectively subjected to UV radiation in the area of the conductor structures to be produced. As a result metal nuclei are released and the area is metallized by chemical reduction. This makes it possible to obtain fine conductor structures using a simplified and reliable method.

SUMMARY OF THE INVENTION

It is an object of the present invention to provide improved conductor track structures on circuit substrates.

Another object of the invention is to provide conductor track structures on circuit substrates which can be produced simply and reliably.

A further object of the invention is to provide conductor track structures on circuit substrates which contain a comparatively low proportion of nucleating additives.

An additional object is to provide conductor track structures on circuit substrates which stable even at soldering temperatures.

It is also an object of the invention to provide a simple and reliable method for producing conductor track structures.

Yet another object of the invention is to provide a method for producing conductor track structures on circuit substrates in which compounding or injection molding of modern high-temperature plastics is possible.

These and other objects are achieved in accordance with the present invention by providing a conductor track structure on a non-conductive supporting material comprising a metallized layer applied to metal nuclei created by breaking up very finely distributed non-conductive metal compounds contained in the supporting material by irradiating portions of the supporting material with electromagnetic radiation, wherein the non-conductive metal compounds are thermally stable inorganic oxides which are stable and insoluble in aqueous acid or alkaline metallization baths, and which are selected from the group consisting of higher oxides which contain at least two different kinds of cations and have a spinel structure or spinel-related structure, and which remain unchanged in non-irradiated areas of the supporting material. Classic spinels are mixed metal oxides of magnesium and aluminum, but the magnesium may be wholly or partially replaced by iron, zinc and/or manganese, and the aluminum by iron and/or chromium. Spinel-related mixed oxide structures also may contain nickel and/or cobalt cations.

In accordance with a further aspect of the invention, the objects are achieved by providing a method of producing a conductor track structure on a non-conductive support comprising providing a non-conductive support having at least a surface formed of a non-conductive supporting material having at least one thermally stable, spinel-based, non-conductive metal oxide which is stable and insoluble in aqueous acid or alkaline metallization baths dispersed therein; irradiating areas of said support on which conductive tracks are to be formed with electromagnetic radiation to break down the non-conductive metal oxides and release metal nuclei, and subsequently metallizing the irradiated areas by chemical reduction.

Further aspects and refinements of the invention are described hereinafter.

The invention uses the non-conductive metal compounds of thermally highly stable inorganic oxides which are stable and insoluble in aqueous acid or alkaline metallization baths and which are higher oxides having the structure of spinels or structures that are similar to the spinel structures. As a result these metal compounds can remain unchanged on the surface of the supporting material even in non-irradiated areas. The inorganic oxides used are so resistant to heat that they remain stable even after having been exposed to soldering temperatures, i.e., they do not become electrically conductive and they remain stable in the baths used for metallization. The inorganic oxides used are extremely heat-resistant even with the use of selective laser sintering of plastic powders, which is known per se and which in practice is referred to by the generic term rapid prototyping.

By locally melting the powdered starting material, a component can be produced which is likewise electrically non-conductive and stable in the baths used for metallization. Also feasible is a method in which the component is produced from the liquid phase. The term conductor track structure also includes the borderline case of full metallization, which in electrical engineering is frequently used for shielding purposes.

One preferred embodiment of the invention provides that electromagnetic radiation be used to simultaneously release metal nuclei and effect ablation while forming an adhesion promoting surface. This achieves excellent adhesive strength of the deposited metallic conductor tracks by simple means.

It may be advantageous if the spinel or spinel-related structure contains copper, chromium, iron, cobalt, nickel or a mixture of two or more of the foregoing. Copper may be particularly advantageous.

Preferably, the electrically non-conductive supporting material is a thermoplastic or a thermosetting synthetic resin material. The non-conductive supporting material can contain one or more inorganic fillers, e.g., silicic acid and/or silicic acid derivatives.

Since, according to the invention, spinel-based thermally highly stable non-conductive higher oxides, which contain at least two different kinds of cations and which are stable and insoluble in aqueous acid or alkaline metallization baths, are mixed into the supporting material, the supporting material is processed into components or is applied to components as a coating and metal nuclei are released using electromagnetic radiation in the area of the conductor structures that are to be produced and these areas are then metallized by chemical reduction, the inorganic metal compound in the form of the spinel-based higher oxides can remain on the surface of the supporting material even in the non-irradiated areas. The inorganic higher oxides which contain at least two different kinds of cations used are furthermore sufficiently resistant to heat so that it is possible to use compounding or injection molding of modern high-temperature plastics. The spinel-based higher oxides remain stable even after exposure to soldering temperatures, i.e., they do not become electrically conductive and they remain stable in the metallization baths.

Yet another preferred embodiment of the invention provides that electromagnetic radiation be used to simultaneously release metal nuclei and effect ablation while forming an adhesion-promoting surface. This provides a simple means to achieve excellent adhesive strength of the deposited metallic conductor tracks.

It may further be advantageous if the inorganic oxides contain copper, chromium, iron, cobalt, nickel or mixtures thereof.

Preferably, the non-conductive supporting material is a thermoplastic or a thermosetting synthetic resin material. However, the supporting material can also be made of other suitable non-conductive materials, e.g., a ceramic. The non-conductive supporting material can furthermore contain one or several inorganic fillers, e.g., silicic acid and/or silicic acid derivatives.

It is advantageous to use a laser to produce the electromagnetic radiation to release the metal nuclei. The wavelength of the laser is advantageously 248 nm, 308 nm, 355 nm, 532 nm, 1064 nm or even 10,600 nm.

DETAILED DESCRIPTION OF PREFERRED EMBODIMENTS

The invention will now be described in greater detail with reference to an illustrative embodiment.

70 parts per weight of polybutylene terephthalate, 25 parts by weight of a pyrogenic silicic acid with a BET surface area of 90 $m^2/g$ and 5% of the copper-containing spinel PK 3095 made by Ferro GmbH are compounded in an extruder. In an injection molding process, this granulate is formed into a component, e.g., the housing of a cell phone. The housing is then subjected to laser radiation produced by a diode-pumped Nd:YAG laser with an intensity sufficient to produce slight ablation, which is associated with structured nucleation in the area where the conductor tracks are to be deposited. After a brief treatment in an ultrasound cleaning bath containing demineralized water, the housing is suspended in a commercially available reductive copper-plating bath. In this bath, the conductor tracks are structured in the irradiated areas.

In principle it should be noted that, among experts, simple inorganic compounds of metals and non-metals, such as carbides, nitrides, oxides or sulfides are considered stable and capable of being converted into an elemental metal only with high energy input in the presence of a reducing medium. Furthermore, in an ambient atmosphere, especially in the case of base metals, the metal that may be created is expected to react immediately with the oxygen from the air to form a metal oxide. All the more surprising is the finding according to the invention that metal oxides having the structure of spinels and being very finely distributed and embedded in a plastic matrix, can be exposed and reduced to metal in an ordinary ambient atmosphere using an Nd:YAG laser. The simultaneously formed gaseous decomposition products of the plastic apparently provide a sufficient shielding effect over the metal nuclei that are produced during the very high-energy but also very short laser pulses.

The foregoing description and examples have been set forth merely to illustrate the invention and are not intended to be limiting. Since modifications of the described embodiments incorporating the spirit and substance of the invention may occur to persons skilled in the art, the invention should be construed broadly to include all variations within the scope of the appended claims and equivalents thereof.

What is claimed is:

1. A method of producing a conductor track structure on a non-conductive support comprising:

providing a non-conductive support having at least a surface formed of a non-conductive supporting material having at least one thermally stable, spinel-based, non-conductive metal oxide which is stable and insoluble in aqueous acid or alkaline metallization baths dispersed therein;

irradiating areas of said support on which conductive tracks are to be formed with electromagnetic radiation to break down the non-conductive metal oxides and release metal nuclei, and subsequently metallizing the irradiated areas by chemical reduction.

2. A method according to claim 1, wherein said non-conductive support is provided by dispersing the non-conductive spinel-based metal oxide into the non-conductive supporting material and molding the supporting material containing dispersed metal oxide into a non-conductive support.

3. A method according to claim 1, wherein said non-conductive support is provided by dispersing the non-conductive spinel-based metal oxide into the non-conductive supporting material and coating a substrate with the supporting material containing dispersed metal oxide.

4. A method according to claim 1, wherein the electromagnetic radiation used to release metal nuclei simultaneously ablates the support and forms an adhesion-promoting surface.

5. A method according to claim 1, wherein the non-conductive metal oxide contains copper.

6. A method according to claim 1, wherein the non-conductive supporting material comprises a thermoplastic synthetic resin material.

7. A method according to claim 1, wherein the non-conductive supporting material comprises a thermosetting synthetic resin material.

8. A method according to claim 1, wherein the non-conductive supporting material contains at least one inorganic filler.

9. A method according to claim 8, wherein the at least one inorganic filler is selected from the group consisting of silicic acid and silicic acid derivatives.

10. A method according to claim 1, wherein the electromagnetic radiation is laser radiation.

11. A method according to claim 10, wherein the laser radiation has a wavelength of 248 nm.

12. A method according to claim 10, wherein the laser radiation has a wavelength of 308 nm.

13. A method according to claim 10, wherein the laser radiation has a wavelength of 355 nm.

14. A method according to claim 10, wherein the laser radiation has a wavelength of 532 nm.

15. A method according to claim 10, wherein the laser radiation has a wavelength of 1064 nm.

16. A method according to claim 10, wherein the laser radiation has a wavelength of 10,600 nm.

* * * * *